DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED DECEMBER 1, 1970

881 O.G. 22

T881,005

METHOD OF MAKING A HYDROLYZED CELLULOSE ESTER PRINTING PLATE

Edward C. Yackel, Pittsford, and Donald P. Foster, Hilton, N.Y. (both % Kodak Park Works, Rochester, N.Y. 14650)

Filed May 4, 1970, Ser. No. 34,231
Int. Cl. G03f *7/02*
U.S. Cl. 96—33
1 Sheet Drawing. 13 Pages Specification

Preparation of lithographic printing plates by coating a substantially fully esterified cellulose organic acid ester support with a hydrophilic colloid layer containing silver halide, exposing the sensitive colloid layer to light under an image, developing the exposed layer under conditions of tanning development, treating the layer with a hydrolyzing solution to hydrolyze the portions of the cellulose ester support beneath the non-image areas of the colloid layer, and removing all of the colloid layer from the support.

In one aspect of the invention, after the tanning development step, water-soluble colloid layer in the non-image areas may be washed off and the resulting element containing the insolubilized colloid layer in the image areas treated with a hydrolyzing agent which will not diffuse through the insolubilized colloid layer. Removal of the remaining colloid layer provides the finished product. Additionally, the fidelity of the printed image as well as the resistance of the image area to the hydrolyzing solution is much improved, if after tan-development and washing-out of the colloid layer, the non-image area is treated with alcohol.

Dec. 1, 1970 E. C. YACKEL ET AL T881,005
METHOD OF MAKING A HYDROLYZED CELLULOSE ESTER PRINTING PLATE
Filed May 4, 1970
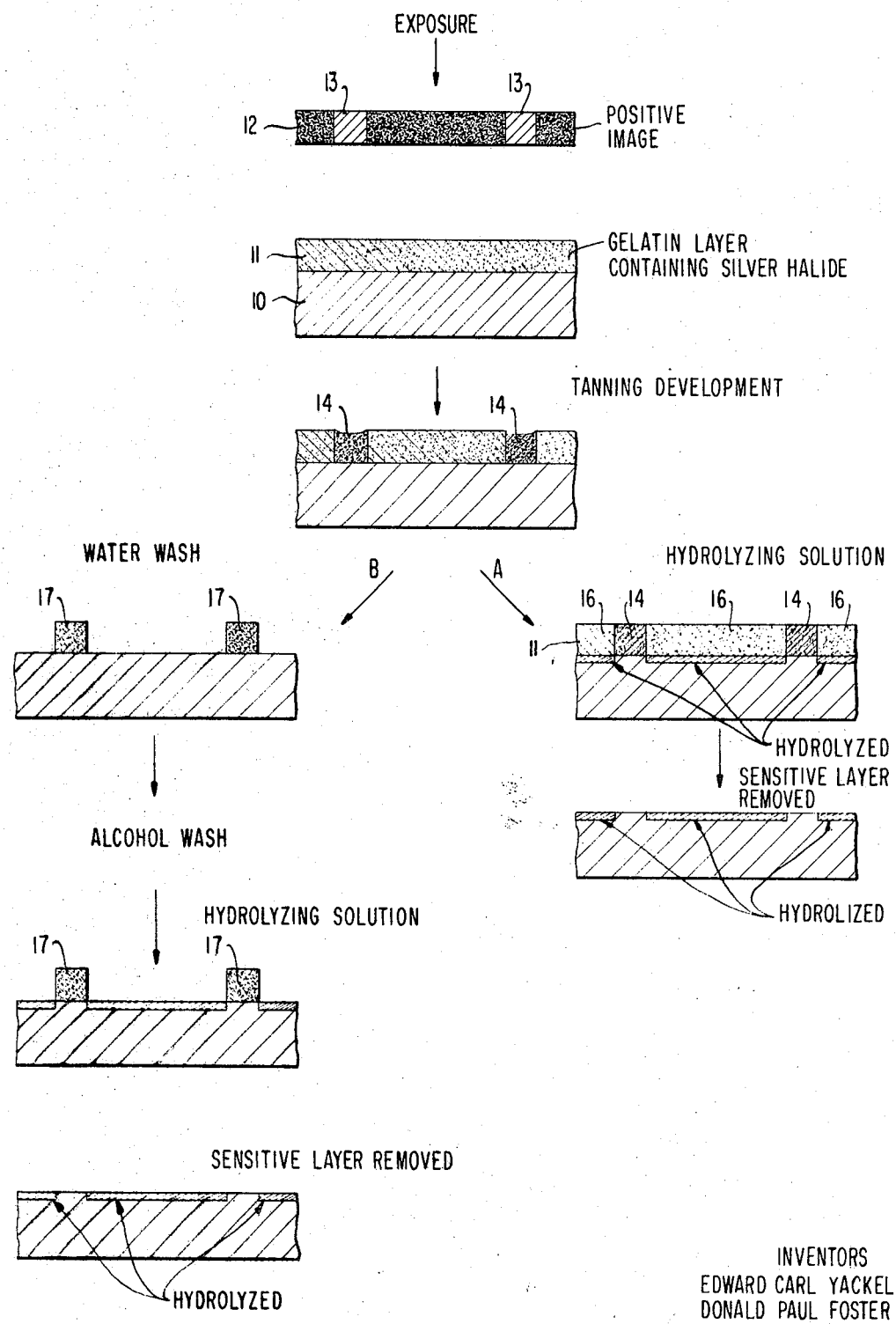
INVENTORS
EDWARD CARL YACKEL
DONALD PAUL FOSTER
BY Henry E. Byers
ATTORNEYS